(12) United States Patent
Serebryanskiy et al.

(10) Patent No.: US 11,372,041 B2
(45) Date of Patent: Jun. 28, 2022

(54) PHASE FREQUENCY RESPONSE MEASUREMENT METHOD

(71) Applicant: Guzik Technical Enterprises, Mountain View, CA (US)

(72) Inventors: Valeriy Serebryanskiy, Santa Clara, CA (US); Semen P. Volfbein, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 17/109,834

(22) Filed: Dec. 2, 2020

(65) Prior Publication Data

US 2022/0170979 A1 Jun. 2, 2022

(51) Int. Cl.
*G01R 31/28* (2006.01)
*H03M 1/10* (2006.01)

(52) U.S. Cl.
CPC ...... *G01R 31/2837* (2013.01); *H03M 1/1095* (2013.01)

(58) Field of Classification Search
CPC .......................... G01R 31/2837; H03M 1/1095
See application file for complete search history.

(56) References Cited

U.S. PATENT DOCUMENTS

| 7,407,670 | B2 * | 8/2008 | Six ...................... A61K 9/1635 424/486 |
| 8,983,796 | B2 * | 3/2015 | Bednorz ................ G01R 23/20 702/176 |
| 9,933,467 | B1 * | 4/2018 | Stein .................... G01R 23/175 |
| 10,256,772 | B2 * | 4/2019 | Ueno ....................... H03D 3/18 |
| 10,962,587 | B2 * | 3/2021 | Frolov ............. G01R 31/31858 |

* cited by examiner

*Primary Examiner* — Manuel A Rivera Vargas
*Assistant Examiner* — Yaritza H Perez Bermudez
(74) *Attorney, Agent, or Firm* — Burns & Levinson LLP; Joseph M. Maraia

(57) ABSTRACT

A measurement of phase frequency response of a device under test (DUT), wherein the DUT is characterized by a set of switchable configurations, comprises choosing the steps of a particular configuration of the DUT having nominal parameters as a reference configuration, measuring an amplitude frequency response $A_{ref}(f)$ and a phase frequency response $\phi_{ref}(f)$ of the reference configuration, processing all configurations of the DUT which are different from the reference configuration, one after another, by measuring an amplitude response $A(f)$ of the configuration being processed, calculating a minimum phase difference response $\Delta\phi_{min}(f)$; and calculating for each configuration, a phase frequency response $\phi(f)$ of the respective configuration which is being processed, in accordance with $\phi(f)=\phi_{ref}(f)+\Delta\phi_{min}(f)$.

4 Claims, 4 Drawing Sheets

PHASE FREQUENCY RESPONSE MEASUREMENT METHOD

FIELD OF THE INVENTION

The technology relates to measurement of phase frequency response of a device under test (DUT), including, but not limited to signal conversion devices, such as high speed analog to digital converters, analog and digital up-converters, down-converters and others.

BACKGROUND OF THE INVENTION

Signal conversion devices are characterized by a frequency response, consisting of amplitude and phase terms. Correction (equalization) of the frequency response is essential for a high quality converter and requires precise measurement of device properties and the phase response dependence on frequency in particular.

The conventional methods of phase frequency response measurements, for example, based on the employment of Vector Network Analyzers (VNAs) have certain limitations which prevent their use with signal conversion devices. First, they require a DUT to have input and output ports which are both of the analog type. As a consequence, these methods are not applicable to such devices as analog to digital converters (ADCs), where the input signal is analog and the output signal is digital. Second, they require that the input and the output signals of a DUT lie in the same frequency range. For these reasons, VNA-based phase frequency response measurement cannot be used for frequency converters.

A method and apparatus for group delay (phase frequency response) measurements, applicable to the signal conversion devices, were proposed in an U.S. Pat. No. 9,933,467 "Group Delay Measurement Apparatus and Method" (the "'467 patent"). The therein-proposed technology comprises means for generating a test signal using two sinusoidal signal sources at low and high frequencies, followed by amplitude limiting of a sum of those signals. The test signal, produced in this way, is injected into a DUT. An amplitude limited signal is obtained at the DUT output, and group delay is determined by simultaneous measurement of signal sideband components and low frequency fundamental phases.

The suggested approach of the '467 patent solves the problem of phase frequency response measurements in DUTs having the input and output of different character. However, application of this method presents certain difficulties. Signal conversion devices using this method, require different setups, making them adequate for different operating conditions. A front end of an analog to digital converter (ADC), for example, should provide different amplification depending on the level of the input signal. For this purpose, one amplifier of the ADC front end is substituted by another, having a different gain, or one attenuator is substituted by another with a different attenuation. However, such substitutions cause changes in frequency responses of the DUT.

The changed-over DUT possesses a number of configurations, with each configuration consisting of a corresponding set of units. Different configurations are described by different frequency responses. To achieve an adequate correction of frequency distortions, the equalizer, which is used in the DUT, should be switchable as well. Its frequency responses should be changed each time the DUT configuration is changed.

Design of a switchable equalizer requires measurements of frequency responses of every configuration in the DUT. The features of DUT configurations differ. In particular, the level of the input signal for different configurations may vary over a wide range. For example, an ADC range of input level variations may reach 30÷40 dB. This means that the generator of the test signals used for measurements of the frequency responses, should have an output level which is changeable within the corresponding limits.

Traditionally, the measurement of an amplitude frequency response is performed with plurality of test signals, with each of the test signals being a sine wave of a single frequency. A sine wave generator with wide range of output signal levels is a simple enough device, and, therefore, measurement of an amplitude frequency response for different DUT configurations does not present any difficulties. By contrast, a phase frequency response measurement method and apparatus applicable to the signal conversion devices and proposed in the '467 patent, requires generation of test signals which occupy a wide frequency range. Construction a generator of test signals occupying a wide frequency range, with a levels varying in a large dynamic range, may present a considerable technical problem. Also, measurement of phase frequency response is time consuming, and, therefore, using the method of the '467 patent for multiple settings of input attenuator, takes a long time and may be not practical. This fact considerably restricts the field of application of the described method.

The purpose of this disclosure is to propose a method of phase frequency response measurement in a DUT with a wide dynamic range of the input signal, and which presumes utilization of the method and apparatus of the the '467 patent and, at the same time, makes it possible to use a test signal generator with a constant output level. The '467 patent is incorporated herein by reference.

SUMMARY

In accordance with the present disclosure, a method of phase frequency response measurement of a DUT consists of choosing one configuration as a reference configuration and performing amplitude and phase response measurements for this reference configuration. For all other DUT configurations, only amplitude frequency responses are measured. For these DUT configurations, a minimum-phase difference between a reference and a current configuration is calculated. A desired phase frequency response is obtained by adding the calculated minimum-phase difference response to the reference phase frequency response.

The practical implementation of the proposed method was verified using a 32 GSamples/s Guzik Technical Enterprises ADP7000 Series digitizer with different input gain settings, and comparing calculated and actual phase frequency responses. The method of this disclosure reduces error of a calculated phase response from 20 degrees to less than 2 degrees in the range of 6-12 GHz, and provides sufficient accuracy for high-speed ADC calibration.

DETAILED DESCRIPTION

Figure 1:
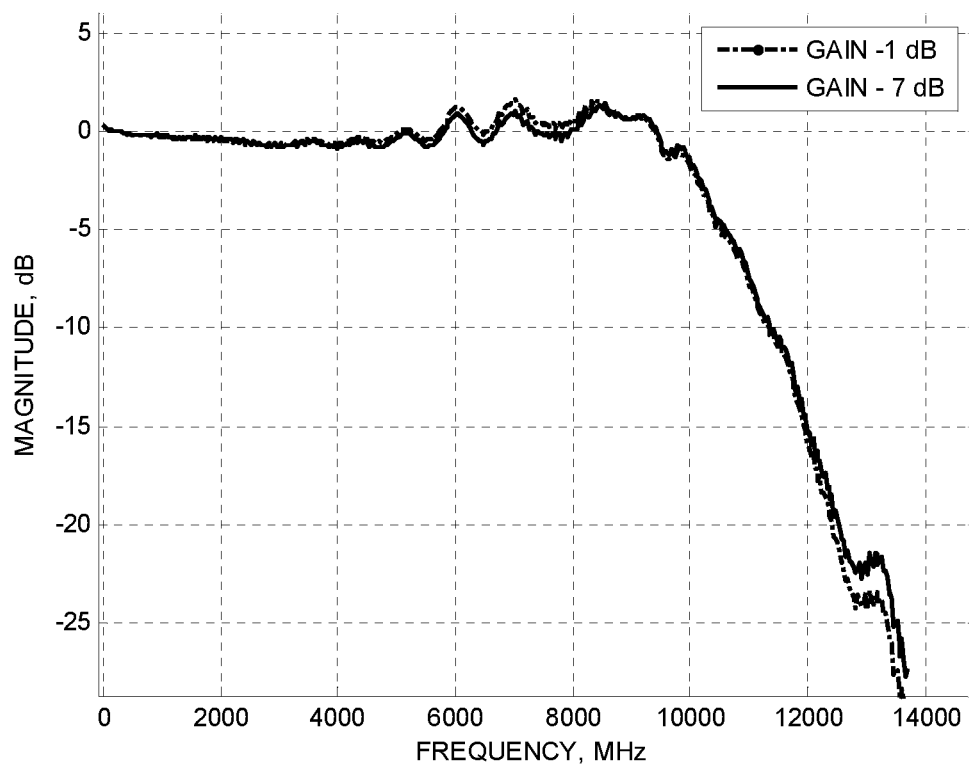
FIG. 1 depicts measured amplitude frequency response of an exemplary DUT with two settings of input gain: −1 dB and −7 dB.

According to the present disclosure, one configuration of a DUT is chosen as a reference configuration. Preferably, a reference configuration with a level of input signal which is close to an output level of the measuring device used to determine the phase frequency response. Such a choice makes it possible to measure for the reference configuration, not only an amplitude frequency response $A_{ref}(f)$, but a phase frequency response $\phi_{ref}(f)$ as well.

After the amplitude frequency response $A_{ref}(f)$, and the phase frequency response $\phi_{ref}(f)$ of the reference configuration have been measured, the remaining DUT configurations are processed one after another. For each configuration to be processed, the amplitude frequency response $A(f)$ is measured. The measured amplitude frequency response $A(f)$ together with the frequency responses $A_{ref}(f)$, and $\phi_{ref}(f)$ of the reference configuration, are used as initial data for calculation of the phase frequency response $\phi(f)$ of the configuration which is being processed. When for all configurations of DUT, the amplitude frequency response $A(f)$ and the phase frequency response $\phi(f)$ are determined, the measurement is completed.

In the theory of electrical circuits, a gain-phase equation established by a Bode Plot, is well known. For a minimum-phase circuit with the complex frequency response $\dot{H}(f)$, it relates the phase frequency response $\phi(f)=\arg\{H(f)\}$ to its amplitude frequency response $A(f)=|\dot{H}(f)|$. Several versions of Bode Plots are possible. One of the versions allows simple implementation in a FPGA. It determines the phase frequency response $\phi(f)$ as a Hilbert transform of a logarithm of an amplitude frequency response $\ln(A(f))$ and consists of the following sequence of operations:

a. calculation of $\ln(A(f))$;
b. calculation of a Fourier transform $F(f)$ of $\ln(A(f))$;
c. equating $F(f)$ to zero at negative f:

$$F_0(f) = \begin{cases} F(f), & \text{if } f \geq 0 \\ 0, & \text{if } f < 0 \end{cases} ; \quad (1)$$

d. determining $\phi(f)$ as an inverse Fourier transform of $F_0(f)$.

Direct attempts to determine the phase frequency response of a DUT, by determining a Bode plot for the measured amplitude frequency response, have been made. However, such attempts often have led to erroneous results. The explanation is simple enough: the common DUT is usually not a minimum-phase circuit.

In the case of an analog to digital converter (taken as an example), the front end comprises, along with other units, an anti-aliasing filter and cables connecting its different parts together. Such circuits are not "minimum-phase" by their nature. As the result, the front end of an ADC is not a minimum-phase circuit.

In accordance with the present disclosure, advantage is taken of the fact that the units which cause the not a minimum-phase character of the DUT, are common to the different DUT configurations. These units are not altered when switching from one DUT configuration to another is performed. Therefore, the minimum phase calculation applied to both DUT configurations, is expected to have identical non-minimum phase terms.

One approach to calculating a change of phase frequency response for different DUT configurations is based on estimating minimum phase terms for each configuration. First, a minimum phase part of the reference frequency response $\phi_{ref}(f)$ is determined. A calculation of a Hilbert transform requires a symmetrical extension (reflection) of a measured amplitude response up to a sampling frequency (twice the Nyquist frequency) corresponding to a property of a real-valued signal Fourier spectra. After this operation, the last point of a frequency response corresponds to a second measured frequency of $A_{ref}(f)$ (with a first (zero) frequency corresponding to DC). A Hilbert transform results in a minimum phase of reference system $\phi_{ref}^{min}(f)$. For determining the phase frequency response of a configuration which is different from reference configuration, a minimum phase calculation similar to that described above is repeated for the measured amplitude response $A(f)$, and then a minimum phase $\phi^{min}(f)$ for this configuration is determined.

A reference phase measurement $\phi_{ref}(f)$ contains non-minimum phase terms corresponding to non-minimum ADC phase units, including an anti-aliasing filter, connecting cables and other elements. However, these parts do not change when a different configuration is used, e.g., for the case of a changing input attenuation. Therefore, a phase response corresponding to the changed configuration $\phi(f)$ can be obtained by adding a difference of minimum phase terms to the reference phase response:

$$\phi(f)=\phi_{ref}(f)+(\phi^{min}(f)-\phi_{ref}^{min}(f))=\phi_{ref}(f)+\Delta\phi_{min}(f) \quad (2)$$

Another embodiment of this method can be realized by using a ratio of a measured amplitude frequency response to the reference configuration amplitude reference response: $A_R(f)=A(f)/A_{ref}(f)$. This amplitude response ratio can be represented as an absolute value of the complex frequency responses ratio having amplitude and phase terms:

$$A_R(f) = \left|\frac{H(f)}{H_{ref}(f)}\right| = \left|\frac{A(f)e^{i\phi(f)}}{A_{ref}(f)e^{i\phi_{ref}(f)}}\right| = \left|\frac{A(f)}{A_{ref}(f)}e^{i(\phi(f)-\phi_{ref}(f))}\right|$$

The complex frequency response of any configuration represents a product of amplitude and phase responses. Phase responses of reference and non-reference configurations comprise both minimum-phase and non-minimum-phase terms. Since non-minimum phase terms of both configurations are the same, they cancel out in the phase difference term, and, therefore, the phase of the amplitude ratio $A_R(f)$ contains exclusively minimum-phase terms.

The frequency response is symmetrically extended similarly to the procedure described above, and minimum phase $\Delta\phi_{min}$ is calculated by using a Hilbert transform. From the above equations, it follows that $\Delta\phi_{min}=(\phi^{min}(f)-\phi_{ref}^{min}(f))$, and, therefore, Eq. (2) above can be used for a phase frequency response calculation.

Figure 1A:
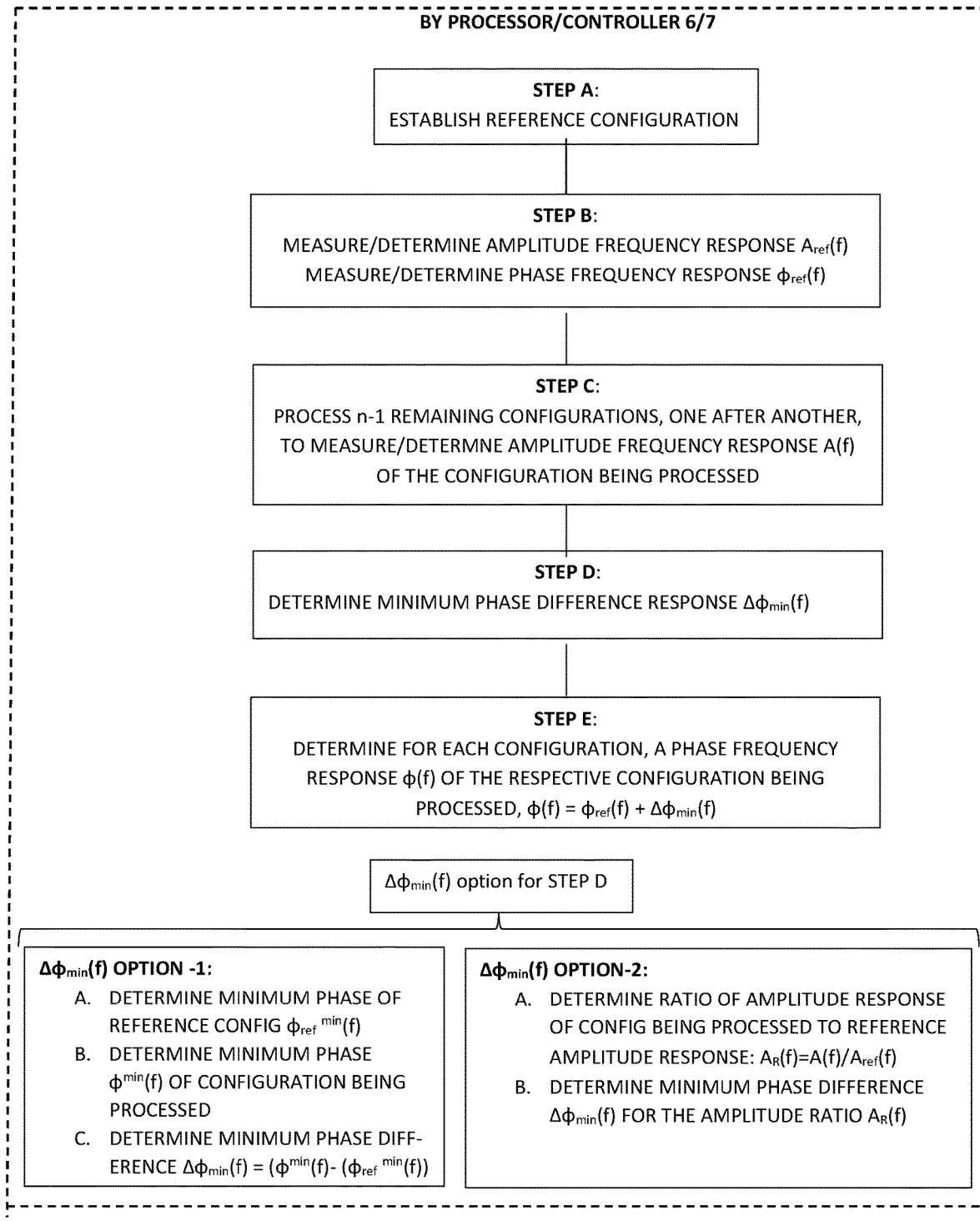
FIG. 1A depicts a flow chart of, and exemplary form of, the method of the invention.

In an exemplary form, a processor/controller 6/7, establishes and controls performance of the method of the invention, for example, as set forth in FIG. 1A, for determining the phase frequency response of a Device Under Test (DUT). In that exemplary form, the DUT is characterized by a set of n switchable configurations, wherein n≥2, and each configuration is characterized by at least one minimum-phase component and zero, one or more non-minimum-phase components. The processor/controller 6/7 is functionally similar to the processing unit 6 and control 7 disclosed in the incorporated reference '947 patent. According to the exemplary method of FIG. 1A, five steps, Steps A-E, are performed by and under the control of processor/controller 6/7:

Step A: one of the n configurations is established as a reference configuration;

Step B: with the DUT in the reference configuration, pursuant to the successive application of an amplitude reference test signal and a phase reference test signal, a reference frequency response $A_{ref}$ and a reference phase frequency response $\varphi_{ref}$ of the DUT are measured/determined;

Step C: with the DUT successively in the remaining n−1 configurations, pursuant to successive amplitude test signals to the DUT in the respective remaining n−1 configurations, an amplitude frequency response A(f) is measured/determined for each of the respective remaining n−1 configurations;

Step D: for each of the respective remaining n−1 configurations, a minimum phase $\Delta \varphi$ is determined; and Step E: for each of the respective remaining n−1 configurations, a respective $\Delta \varphi$ Is combined with $\Delta \varphi_{ref}$ where the aggregate of the reference phase response $\varphi_{ref}$ of the DUT and the respective $\Delta \varphi$s of the remaining n−1 configurations is representative of the phase frequency response of the DUT.

The above general method can be carried out with optional forms of $\Delta \varphi_{min}(f)$:

(1) $\Delta \varphi_{min}(f)$—option 1:
  A. determine minimum phase of reference config $\varphi_{ref}^{min}(f)$
  B. determine minimum phase $\varphi^{min}(f)$ of configuration being processed
  C. determine minimum phase difference $\Delta \varphi_{min}(f) = (\varphi^{min}(f) - (\varphi_{ref}^{min}(f))$ or (2) $\Delta \varphi_{min}(f)$—option 2:
  A. determine ratio of amplitude response of config being processed to reference amplitude response: $A_R(f) = A(f)/A_{ref}(f)$
  B. determine minimum phase difference $\Delta \varphi_{min}(f)$ for amplitude ratio $A_R(f)$.

Figure 2:
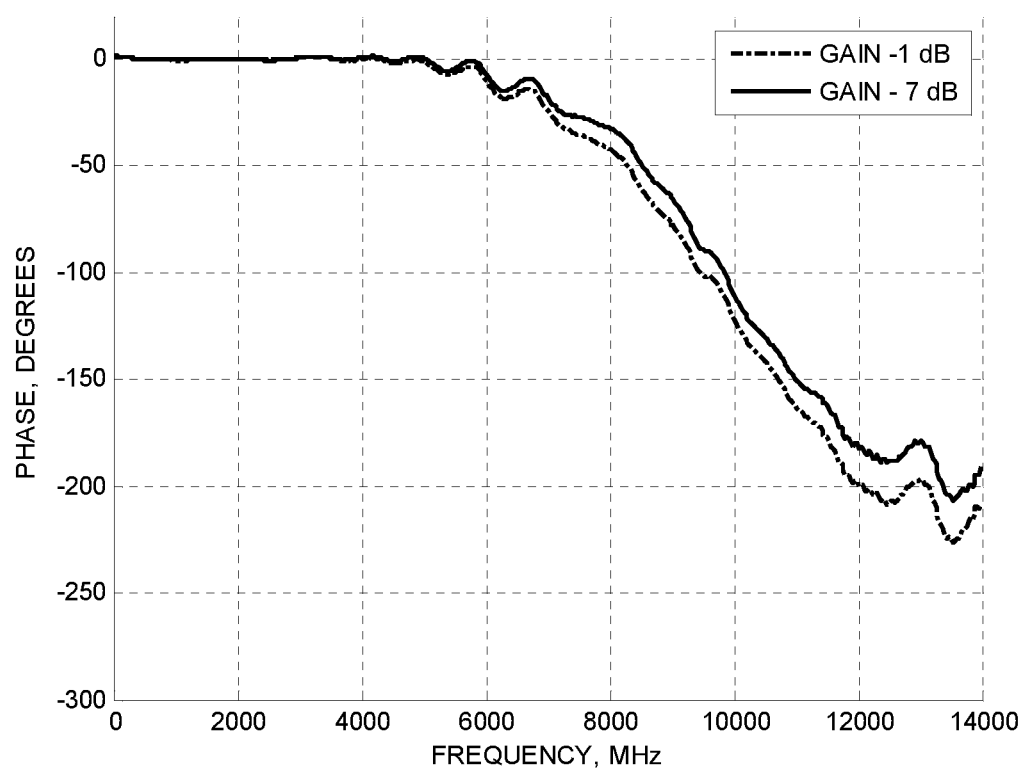
FIG. 2 illustrates phase frequency responses measured for two input gain settings of the DUT corresponding to the amplitude frequency responses shown in FIG. 1.
Figure 3:
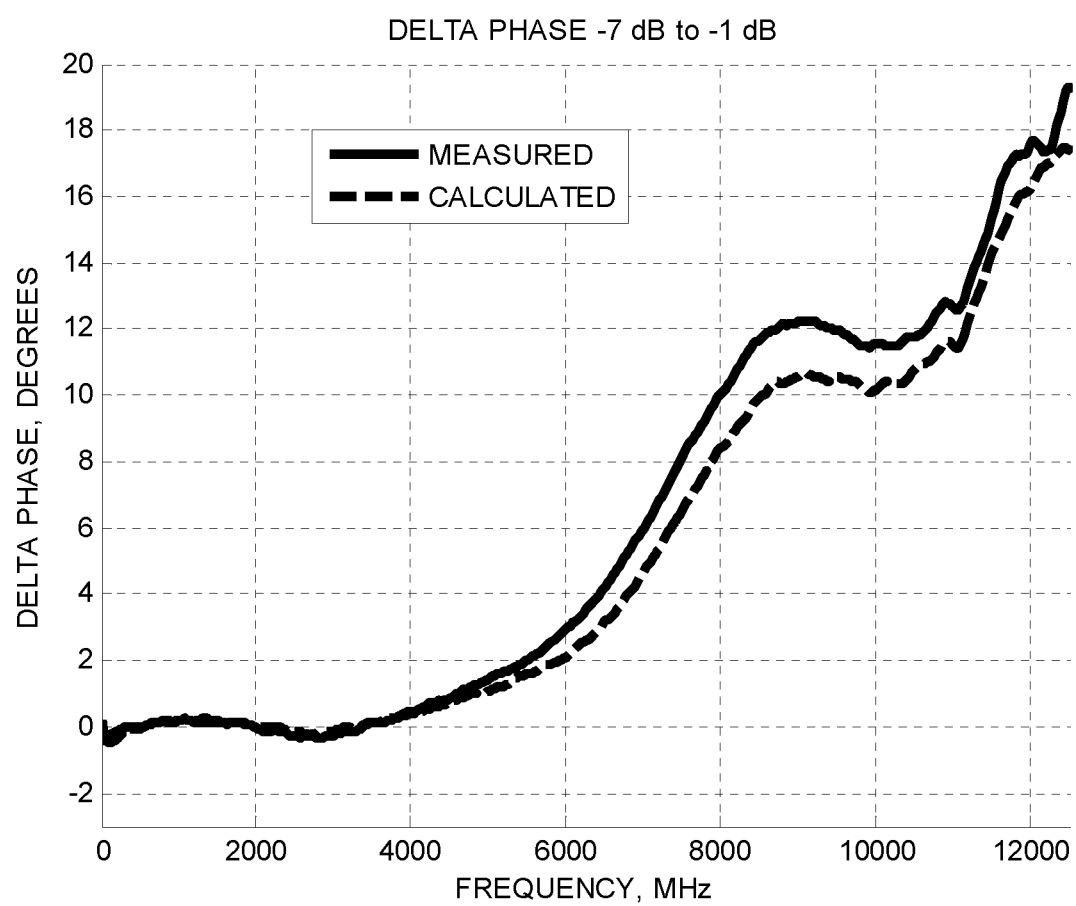
FIG. 3 depicts a difference of the measured phase frequency responses of FIG. 2 and a corresponding difference calculated using a minimum-phase method of current disclosure.

Both embodiments of the described procedure were used for measurement of the Phase response of a 32 GS/s ADC using different input attenuation. The results are shown in FIGS. 1-3. FIGS. 1 and 2 depict amplitude and phase responses for two different ADC attenuation settings (−1 dB and −7 dB). A full frequency range phase response was measured in both settings for purpose of validation of the minimum phase response method. FIG. 3 shows a difference of phase responses between these gain settings. As shown, the phase deviation exceeds 10 degrees at 8 GHz and increases to 20 degrees around 12.5 GHz. The phase response for the gain setting of −7 dB using the reference phase response, and the minimum phase calculation is within a 2 degree range from the actual measurement. The small phase difference is due to small residual non-minimum phase components. The estimation of minimum phase results in an order of magnitude improvement of the phase estimation accuracy for the different input gains of ADC.

Therefore, the disclosed invention achieves a high accuracy of the phase frequency response measurement by utilizing a minimum-phase difference method. This method simplifies the measurement setup by using standard signal generating devices and provides considerable time gains for calibration of a device under test.

Although this invention has been described in terms of certain embodiments, other embodiments that are apparent to those of ordinary skill in the art, including embodiments which do not provide all the benefits and features set forth herein, are also within the scope of this invention. Accordingly, the scope of the present invention is defined only by reference to the appended claims.

What is claimed is:

1. A method of determining a phase frequency response for a device under test (DUT), wherein the DUT is characterized by a set of n switchable configurations, wherein N>2, and each switchable configuration is characterized by at least one minimum-phase component and zero, one or more nonminimum-phase components, said method comprising the steps of:

by a processor/controller;
A. establishing a particular configuration of the DUT having nominal parameters as a reference configuration;
B. determining an amplitude frequency response $A_{ref}(f)$ and a phase frequency response $\phi_{ref}(f)$ of the reference configuration;
C. processing all of the remaining n−1 switchable configurations of the DUT which are different from the reference configuration, one after another, by determining an amplitude frequency response A(f) of each of the remaining n−1 switchable configurations being processed;
D. determining for each of the n=1 remaining switchable configurations, a minimum phase difference response $\Delta \phi_{min}(f)$; and
E. determining for each of the n−1 remaining switchable configurations, a phase frequency $\phi(f)$ of the respective switchable configuration being processed, in accordance with $\phi(f) = \phi_{ref}(f) + \Delta \phi_{min}(f)$;

whereby the determined phase frequency responses $\phi(f)$ for the n switchable configurations are representative of the phase frequency response determined for the DUT.

2. The method of claim 1, wherein said set of switchable configurations comprises a set of different input gain settings associated with each of the respective switchable configurations of the DUT.

3. The method of claim 1, wherein the step of determining the minimum phase difference response $\Delta \phi_{min}(f)$ performed by the processor/controller, comprises the steps of:
A. determining a minimum-phase $\phi_{ref}^{min}(f)$ of the reference configuration;
B. determining a minimum-phase $\phi^{min}(f)$ of the switchable configuration being processed; and
C. determining the difference $\Delta \phi_{min}(f) = \phi^{min}(f) - \phi_{ref}^{min}(f)$.

4. The method of claim 1, wherein the step of determining the minimum phase difference response $\phi_{min}(f)$ performed by the processor/controller, comprises the steps of:

For each of the n=1 remaining switchable configurations as they are processed;
A. determining an amplitude response ration $A_R(f)$ of the amplitude frequency response A(f) of the switchable configuration being processed to the reference amplitude frequency response $A_{ref}(f)$, where $A_R(f) = A(f)/A_{ref}(f)$; and
B. determining the minimum phase difference $\Delta \phi_{min}(f)$ of the amplitude response ratio $A_R(f)$.

* * * * *

UNITED STATES PATENT AND TRADEMARK OFFICE
CERTIFICATE OF CORRECTION

PATENT NO. : 11,372,041 B2
APPLICATION NO. : 17/109834
DATED : June 28, 2022
INVENTOR(S) : Valeriy Serebryanskiy and Semen P. Volfbein It is certified that error appears in the above-identified patent and that said Letters Patent is hereby corrected as shown below:

In the Claims

Claim 1, Column 6, Line 13:
by a set of n switchable configurations, wherein N>2,
Should read:
-- by a set of n switchable configurations, wherein n$\geq$2 --

Claim 1, Column 6, Line 18:
by a processor/controller;
Should read:
-- by a processor/controller: --

Claim 1, Column 6, Line 31:
determining for each of the n=1 remaining switchable configurations,
Should read:
-- determining for each of the n-1 remaining switchable configurations, --

Claim 3, Column 6, Line 52:
C. determining the difference $\Delta\phi_{min}(f) = \phi^{min}(f) - \phi_{ref}^{min}(f)$.
Should read:
-- C. determining the difference $\Delta\phi_{min}(f) = (\phi^{min}(f) - \phi_{ref}^{min}(f))$. --

Claim 4, Column 6, Line 54:
the minimum phase difference response $\phi_{min}(f)$ performed
Should read:
-- the minimum phase difference response $\Delta\phi_{min}(f)$ performed --

Claim 4, Column 6, Line 56:
For each of the n=1 remaining switchable configurations Signed and Sealed this
Twenty-fifth Day of October, 2022

Katherine Kelly Vidal
*Director of the United States Patent and Trademark Office*

Should read:
-- For each of the n-1 remaining switchable configurations --

Claim 4, Column 6, Line 57:
as they are processed;
Should read:
-- as they are processed: --

Claim 4, Column 6, Line 58:
determining an amplitude response ration
Should read:
-- determining an amplitude response ratio --